(12) United States Patent
Houle

(10) Patent No.: US 7,218,000 B2
(45) Date of Patent: May 15, 2007

(54) LIQUID SOLDER THERMAL INTERFACE MATERIAL CONTAINED WITHIN A COLD-FORMED BARRIER AND METHODS OF MAKING SAME

(75) Inventor: Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/607,782

(22) Filed: Jun. 27, 2003

(65) Prior Publication Data

US 2004/0262766 A1    Dec. 30, 2004

(51) Int. Cl.
*H01L 23/34*    (2006.01)

(52) U.S. Cl. .................. 257/714; 257/687; 257/712; 257/E23.097; 257/E23.098; 361/699

(58) Field of Classification Search ................ 257/678, 257/683, 687, 706, 712, 714; 361/689, 697, 361/698, 699, 709, 710
See application file for complete search history.

(56) References Cited

U.S. PATENT DOCUMENTS

| | | | | |
|---|---|---|---|---|
| 4,915,167 A | * | 4/1990 | Altoz | 165/185 |
| 5,386,143 A | * | 1/1995 | Fitch | 257/715 |
| 6,085,831 A | * | 7/2000 | DiGiacomo et al. | 165/104.33 |
| 6,410,981 B2 | * | 6/2002 | Tao | 257/704 |
| 6,429,513 B1 | * | 8/2002 | Shermer et al. | 257/714 |
| 6,448,637 B1 | * | 9/2002 | Studebaker | 257/678 |
| 2002/0154483 A1 | * | 10/2002 | Homer et al. | 361/704 |

FOREIGN PATENT DOCUMENTS

JP    63096945 A    *    4/1988

* cited by examiner

*Primary Examiner*—Jerome Jackson
*Assistant Examiner*—Matthew E. Warren
(74) *Attorney, Agent, or Firm*—Schwegman, Lundberg, Woessner & Kluth, P.A.

(57) ABSTRACT

In a process of making a container barrier upon a heat spreader, the heat spreader is augmented with a cold-formed o-ring, and thereafter, it is bonded to a die. A liquid solder is filled into the space created by the o-ring. The thermal interface material can also have one of several footprints to facilitate heat transfer.

19 Claims, 8 Drawing Sheets

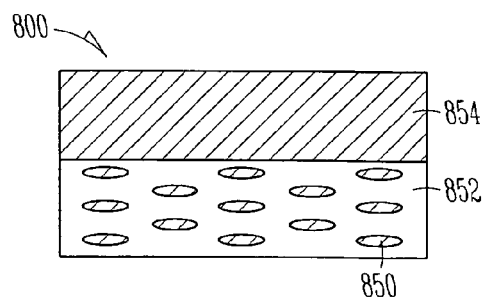
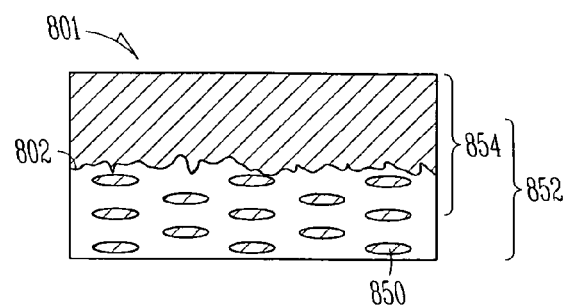
FIG. 8A  FIG. 8B
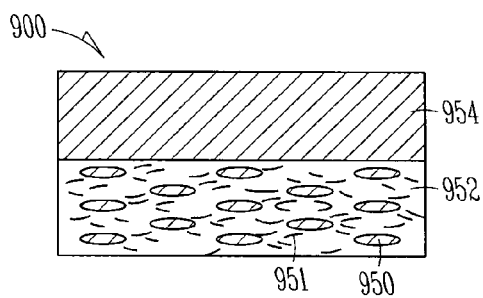
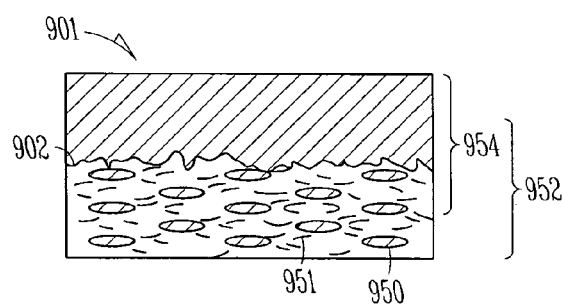
FIG. 9A  FIG. 9B
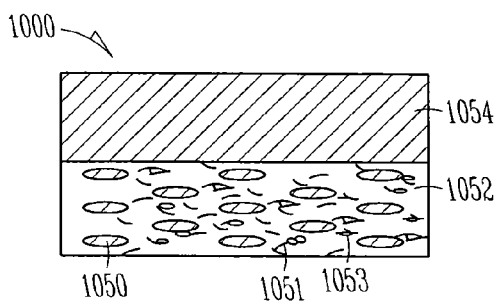
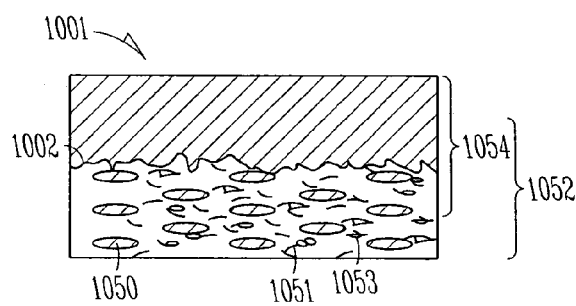
FIG. 10A  FIG. 10B

LIQUID SOLDER THERMAL INTERFACE MATERIAL CONTAINED WITHIN A COLD-FORMED BARRIER AND METHODS OF MAKING SAME

TECHNICAL FIELD

Disclosed embodiments relate to a container barrier thermal interface material for a heat sink. The container barrier thermal interface material is coupled with a die and a heat sink to form a package.

BACKGROUND INFORMATION

An integrated circuit (IC) die is often fabricated into a microelectronic device such as a processor. The increasing power consumption of processors results in tighter thermal budgets for a thermal solution design when the processor is employed in the field. Accordingly, a thermal interface is often needed to allow the die to reject heat more efficiently.

Various techniques have been employed to transfer heat away from a die. These techniques include passive and active configurations. One passive configuration involves a conductive material in thermal contact with the backside of a packaged die. This conductive material is often a slug, a heat spreader, or an integrated heat spreader (IHS).

A heat spreader is employed to spread and dissipate the heat generated by a die, to minimize concentrated high-heat locations within the die. A heat spreader is attached proximate the back side of a microelectronic die with a thermally conductive material, such as a thermal interface material (TIM). A TIM can include, for example, thermally conductive gels, thermal greases, or solders. Heat spreaders include materials such as aluminum, copper, copper alloy, or ceramic, among others.

With conventional technology, a packaged microelectronic device includes a die that is bonded from the backside to an IHS. An IHS adhesive layer acts as a TIM to bond the die to the IHS.

BRIEF DESCRIPTION OF THE DRAWINGS

In order to understand the manner in which embodiments are obtained, a more particular description of various embodiments briefly described above will be rendered by reference to the appended drawings. These drawings depict only typical embodiments that are not necessarily drawn to scale and are not to be considered to be limiting of its scope. Some embodiments will be described and explained with additional specificity and detail through the use of the accompanying drawings in which:

FIG. 8A is a side cross-section of a container barrier subsystem according to an embodiment;

FIG. 8B depicts the container barrier composite in FIG. 1A after further processing;

FIG. 9A is a side cross-section of a container barrier subsystem according to an embodiment;

FIG. 9B depicts the container barrier composite in FIG. 2A after further processing;

FIG. 10A is a side cross-section of a container barrier subsystem according to an embodiment;

FIG. 10B depicts the container barrier composite in FIG. 3A after further processing;

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structures of embodiments most clearly, the drawings included herein are diagrammatic representations of various embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
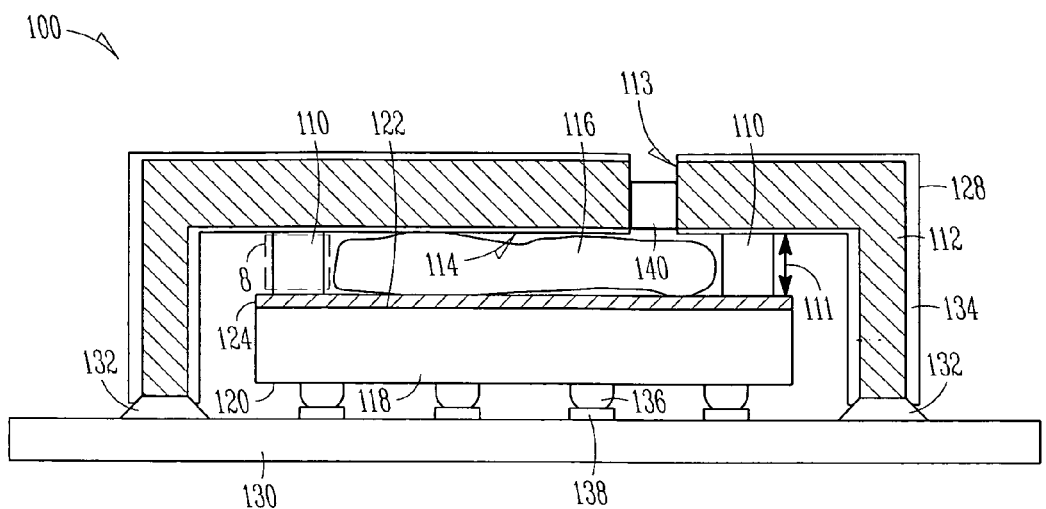
FIG. 1 is a side cross-section of a package according to an embodiment.

FIG. 1 is a side cross-section of a package 100 according to an embodiment. The package includes a container barrier 110 that is disposed against a heat sink, which in this embodiment includes an integrated heat spreader 112 (IHS). Together, the container barrier 110 and the IHS 112 form a recess 114. A liquid heat-transfer medium 116 is disposed in the recess 114. The liquid heat-transfer medium 116 is depicted in arbitrary size and shape. In one embodiment, the liquid heat-transfer medium 116 entirely fills the recess 114.

By "liquid heat-transfer medium", it is understood that the liquid heat transfer medium can be a solid at room temperature, but that it is liquified by a temperature of at least about 100° C. In one embodiment, the liquid heat transfer medium is a liquid at about one-half the maximum operating temperature of a given die. In one embodiment, the liquid heat transfer medium is a liquid at about two-thirds the maximum operating temperature of a given die. In one embodiment, the liquid heat transfer medium is a liquid at about three-fourths the maximum operating temperature of a given die. In one embodiment, the liquid heat transfer medium is a liquid at about four-fifths the maximum operating temperature of a given die. In one embodiment, the liquid heat transfer medium is a liquid at about nine-tenths the maximum operating temperature of a given die.

A first heat transfer-medium access 113 is disposed in the IHS 112. The first heat transfer-medium access 113 is also referred to as a first channel through the heat spreader. In one embodiment, the first heat transfer-medium access 113 is used for filling a liquified heat transfer medium through the first heat transfer-medium access 113. In other embodiments, however, a substantially solid material is placed into the package 100 before assembly, and the liquid heat-transfer medium 116 melts upon operational heating of the die 118.

Several materials can be used as the liquid heat-transfer medium 116. In one embodiment, the liquid heat-transfer medium 116 is an organic fluid such as ethylene glycol and the like. In one embodiment, the liquid heat-transfer medium 116 is an organic composition that has a latent heat of fusion that is somewhere above room temperature (about 25° C.) and below about 100° C.

In one embodiment, the liquid heat-transfer medium 116 is a low-melting-point metal. In one embodiment the liquid heat-transfer medium 116 is INDALLOY® 51, manufactured by the Indium Corporation of America of Utica, N.Y. In one embodiment, the liquid heat-transfer medium 116 is a Ga—In—Sn alloy with a melting point of about 11° C. In one embodiment the liquid heat-transfer medium 116 is INDALLOY® 60, a Ga—In alloy with a melting point of about 16° C. In one embodiment the liquid heat-transfer medium 116 is francium, Fr with a melting point of about 27° C. In one embodiment the liquid heat-transfer medium 116 is cesium, Cs with a melting point of about 28° C. In one embodiment the liquid heat-transfer medium 116 is gallium, Ga with a melting point of about 30° C. In one embodiment the liquid heat-transfer medium 116 is rubidium, Rb with a melting point of about 39° C. In one embodiment the liquid heat-transfer medium 116 is INDALLOY® 117, a Bi—Pb—In—Sn—Cd material with a melting point of about 47° C. In one embodiment the liquid heat-transfer medium 116 is INDALLOY® 136, a Bi—In—Pb—Sn material with a melting point of about 58° C. In one embodiment the liquid heat-transfer medium 116 is INDALLOY® 19, an In—Bi—Sn material with a melting point of about 60° C. In one embodiment the liquid heat-transfer medium 116 is INDALLOY® 158, a Bi—Pb—Sn—Cd material with a melting point of about 70° C. In one embodiment the liquid heat-transfer medium 116 is INDALLOY® 162, an In—Bi material with a melting point of about 72° C. In one embodiment the liquid heat-transfer medium 116 is INDALLOY® 174, a Bi—In—Sn material with a melting point of about 79° C. In one embodiment the liquid heat-transfer medium 116 is INDALLOY® 8, an In—Sn—Cd material with a melting point of about 93° C. In one embodiment the liquid heat-transfer medium 116 is INDALLOY® 42, a Bi—Sn—Pb material with a melting point of about 96° C. In one embodiment, a combination of two of the above materials is included in the liquid heat-transfer medium 116. In one embodiment, a combination of three or more of the above materials is included in the liquid heat-transfer medium 116.

The package 100 includes a die 118 with an active surface 120 and a backside surface 122. As set forth above, the die 118 is connected to a thermal management device that in one embodiment is the IHS 112. In one embodiment, the die 118 includes a cladding layer 124. In one embodiment, the IHS 112 includes a cladding layer 128.

The container barrier 110 and the liquid heat-transfer medium 116 form a thermal interface material (TIM) that also creates a bond-line thickness 111 (BLT). In this embodiment, the BLT 111 is in a range from about 100 Å to about 1,000 micrometer (μm).

The IHS 112 is attached to a mounting substrate 130 with a bonding material 132 that secures a lip portion 134 of the IHS 112 thereto. The die 118 is disposed between the container barrier 110 and a series of electrical bumps 136 that are in turn each mounted on a series of bond pads 138. The electrical bumps 136 make contact with the active surface 120 of the die 118. In one embodiment, the electrical bumps 136 are depicted in a ball grid array as is known in the art.

By contrast, the container barrier 110 makes thermal contact with the backside surface 122 of the die 118. Additionally, the liquid heat-transfer medium 116, disposed in the recess 114, also makes thermal contact with the backside surface 122 of the die 118. The container barrier 110 holds a plug 140 that resists the flow of the liquid heat-transfer medium 116 out of the recess 114. In one embodiment, the plug 140 is gas-permeable for single-direction flow. In this embodiment, any outgassing of the liquid heat-transfer medium 116 flows out of the recess 114 through the plug 140, but reverse flow is resisted.

Figure 2:
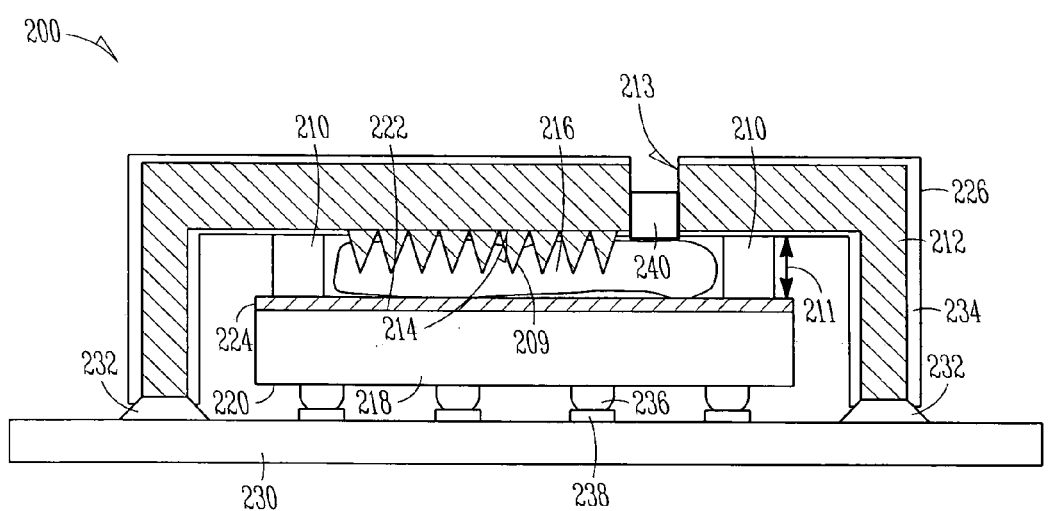
FIG. 2 is a side cross-section of a package according to an embodiment.

FIG. 2 is a side cross-section of a package 200 according to an embodiment. The package 200 includes a container barrier 210 that is disposed against a heat sink, which in this embodiment includes an IHS 212. Together, the container barrier 210 and the IHS 212 form a recess 214. A liquid heat-transfer medium 216 is disposed in the recess 214. A first heat transfer-medium access 213 is disposed in the IHS 212. Several materials can be used as the liquid heat-transfer medium 216, including those referred to the several embodiments, separately, or in combination as set forth above in relation to FIG. 1.

The package 200 includes a die 218 with an active surface 220 and a backside surface 222. A set forth above, the die 218 is connected to a thermal management device that in one embodiment is the IHS 212. In one embodiment, the die 218 includes a cladding layer 224. In one embodiment, the IHS 212 includes a cladding layer 226. In one embodiment, the heat sink, in this embodiment depicted as the IHS 212, includes a variable surface 209 that interfaces with the liquid heat-transfer medium 216. The variable surface 209 is depicted in FIG. 2 in arbitrary amplitude, frequency, and shape. In one embodiment, the size and shape of the variable surface 209 is stamped into the IHS 212. In one embodiment, the size and shape of the variable surface 209 is cut into the IHS 212 after its formation. In one embodiment, the size and shape of the variable surface 209 is brushed into the IHS 212 such as with a wire brush action. In one embodiment, the size and shape of the variable surface 209 is formed by a combination of at least two of stamping, cutting, and brushing. Other methods can be employed to impart the variable surface 209 into the IHS 212.

The container barrier 210 and the liquid heat-transfer medium 216 form a TIM that also creates a BLT 211. In this embodiment, the BLT 211 is in a range from about 100 Å to about 1,000 μm. With the variable surface 209, a convoluted interface forms between the liquid heat-transfer medium 216 and the IHS 212. In this embodiment where the liquid heat-transfer medium 216 includes a higher heat transfer coefficient than the IHS 212, the large surface area created by the variable surface 209 of the IHS 212 facilitates heat transfer away from the die 218.

In one embodiment, the IHS 212 is attached to a mounting substrate 230 with a bonding material 232 that secures a lip portion 234 of the IHS 212 thereto. The die 218 is disposed between the container barrier 210 and a series of electrical bumps 236 that are in turn each mounted on a series of bond pads 238. The electrical bumps 236 make contact with the active surface 220 of the die 218. In one embodiment, the electrical bumps 236 are depicted in a ball grid array as is known in the art.

By contrast, the container barrier 210 makes thermal contact with the backside surface 222 of the die 218. Additionally, the liquid heat-transfer medium 216, disposed in the recess 214, also makes thermal contact with the backside surface 222 of the die 218. The container barrier 210 holds a plug 240 that resists the flow of the liquid heat-transfer medium 216 out of the recess 214. In one embodiment, the plug 240 is gas-permeable for single-direction flow. In this embodiment, any outgassing of the liquid heat-transfer medium 216 flows out of the recess 214 through the plug 240, but reverse flow is resisted.

Figure 3:
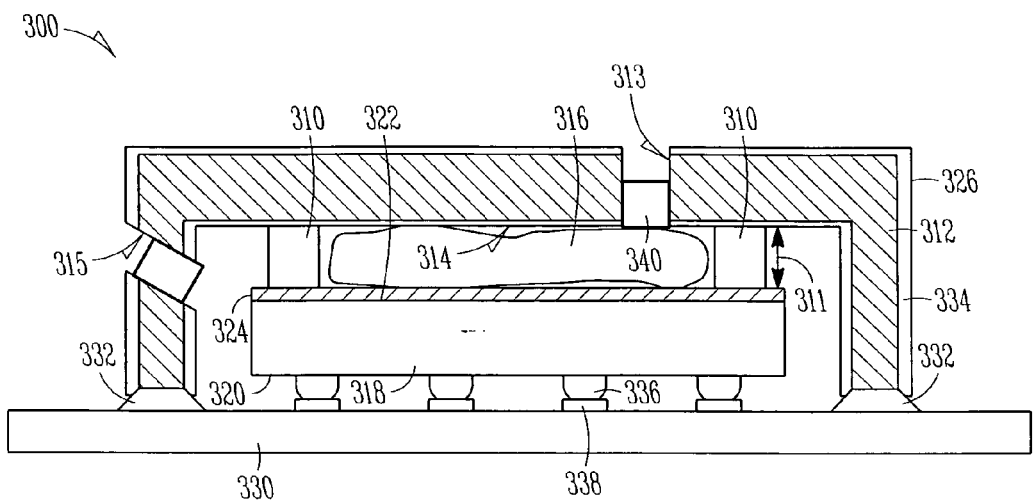
FIG. 3 is a side cross-section of a package according to an embodiment.

FIG. 3 is a side cross-section of a package 300 according to an embodiment. The package 300 includes a container barrier 310 that is disposed against a heat sink, which in this embodiment includes an integrated heat spreader 312 (IHS). Together, the container barrier 310 and the IHS 312 form a recess 314. A liquid heat-transfer medium 316 is disposed in the recess 314. A first heat transfer-medium access 313 is disposed in the IHS 312. The first heat transfer-medium access 313 is also referred to as a first channel through the heat spreader. Additionally, a first underfill-medium access 315 is disposed in the IHS 312. The first heat transfer-medium access 313 allows for filling the liquid heat-transfer medium 316 into the package 300 after assembly thereof. Several materials can be used as the liquid heat-transfer medium 316, including those referred to the several embodiments, separately, or in combination as set forth above in relation to FIG. 1. In one embodiment, the underfill material is a conventional organic thermoplastic.

In one embodiment, the package 300 includes a die 318 with an active surface 320 and a backside surface 322. A set forth above, the die 318 is connected to a thermal management device that in one embodiment is the IHS 312. In one embodiment, the die 318 includes a cladding layer 324. In one embodiment, the IHS 312 includes a cladding layer 326.

In this embodiment, the heat sink depicted as the IHS 312, includes thermal interface access 313 and an underfill access 315. The container barrier 310 and the liquid heat-transfer medium 316 form a TIM that also creates a BLT 311. In this embodiment, the BLT 311 is in a range from about 100 Å to about 1,000 μm.

In one embodiment, the IHS 312 is attached to a mounting substrate 330 with a bonding material 332 that secures a lip portion 334 of the IHS 312 thereto. The die 318 is disposed between the container barrier 310 and a series of electrical bumps 336 that are in turn each mounted on a series of bond pads 338. The electrical bumps 336 make contact with the active surface 320 of the die 318. In one embodiment, the electrical bumps 336 are depicted in a ball grid array as is known in the art.

By contrast, the container barrier 310 makes thermal contact with the backside surface 322 of the die 318. Additionally, the liquid heat-transfer medium 316, disposed in the recess 314, also makes thermal contact with the backside surface 322 of the die 318. The container barrier 310 holds a plug 340 that resists the flow of the liquid heat-transfer medium 316 out of the recess 314. In one embodiment, the plug 340 is gas-permeable for single-direction flow. In this embodiment, any outgassing of the liquid heat-transfer medium 316 flows out of the recess 314 through the plug 340, but reverse flow is resisted.

Figure 4:
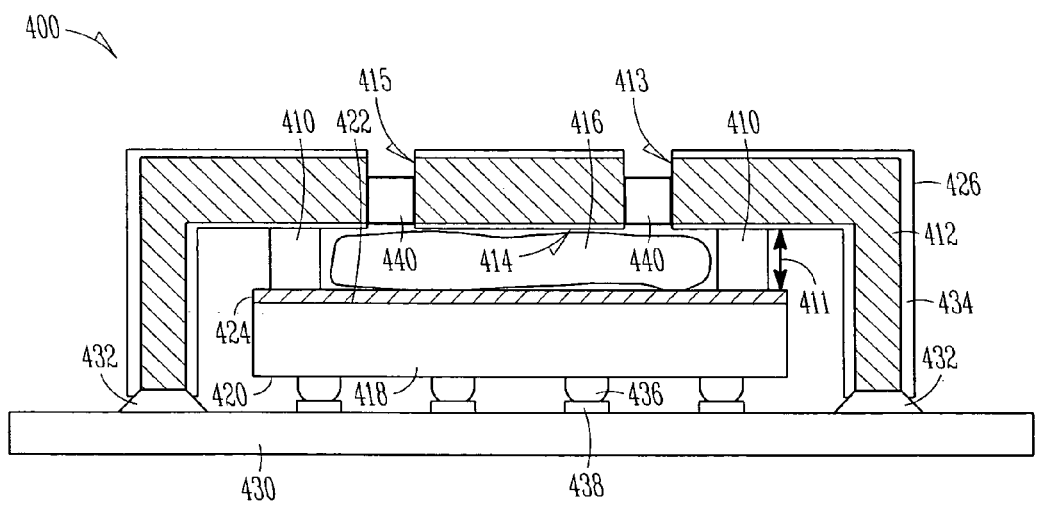
FIG. 4 is a side cross-section of a package according to an embodiment.

FIG. 4 is a side cross-section of a package 400 according to an embodiment. The package includes a container barrier 410 that is disposed against a heat sink, which in this embodiment includes an IHS 412. Together, the container barrier 410 and the IHS 412 form a recess 414. A liquid heat-transfer medium 416 is disposed in the recess 414. Several materials can be used as the liquid heat-transfer medium 416, including those referred to the several embodiments, separately, or in combination as set forth above in relation to FIG. 1.

A first heat transfer-medium access 413 is disposed in the IHS 412. The first heat transfer-medium access 413 is also referred to as a first channel through the heat spreader. Additonally, a second heat transfer-medium access 415 is disposed in the IHS 412. The second heat transfer-medium access 415 is also referred to as a second channel through the heat spreader. The first and second heat transfer-medium accesses 413 and 415, respectively, are used to pump or draw, or both, the liquid heat-transfer medium 416 into the recess 414. Thereafter, at least one of the first and second heat transfer-medium accesses 413 and 415 can be sealed. In one embodiment, one access is sealed and the other is plugged with a plug 440 such as the plug 140 depicted in FIG. 1.

The package 400 includes a die 418 with an active surface 420 and a backside surface 422. A set forth above, the die 418 is connected to a thermal management device that in one embodiment is the IHS 412. In one embodiment, the die 418 includes a cladding layer 424. In one embodiment, the IHS 412 includes a cladding layer 426.

The container barrier 410 and the liquid heat-transfer medium 416 form a TIM that also creates a BLT 411. In this embodiment, the BLT 411 is in a range from about 100 Å to about 1,000 micrometer (μm).

The IHS 412 is attached to a mounting substrate 430 with a bonding material 432 that secures a lip portion 434 of the IHS 412 thereto. The die 418 is disposed between the container barrier 410 and a series of electrical bumps 436 that are in turn each mounted on a series of bond pads 438. The electrical bumps 436 make contact with the active surface 420 of the die 418. In one embodiment, the electrical bumps 436 are depicted in a ball grid array as is known in the art.

By contrast, the container barrier 410 makes thermal contact with the backside surface 422 of the die 418. Additionally, the liquid heat-transfer medium 416, disposed in the recess 414, also makes thermal contact with the backside surface 422 of the die 418. The container barrier 410 holds a plug 440 that resists the flow of the liquid heat-transfer medium 416 out of the recess 414. In one embodiment, the plug 440 is gas-permeable for single-direction flow. In this embodiment, any outgassing of the liquid heat-transfer medium 416 flows out of the recess 414 through the plug 440, but reverse flow is resisted.

Figure 5:
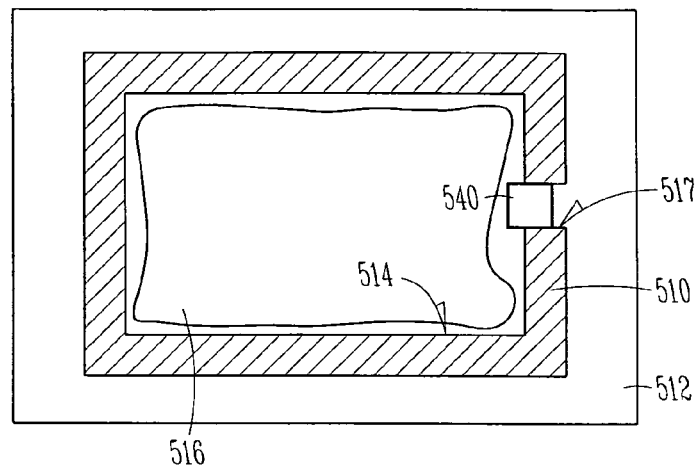
FIG. 5 is a bottom cross-section of a container barrier and a heat sink or hear spreader according to an embodiment.

FIG. 5 is a bottom cross-section of a container barrier 510 and a heat sink 512 or heat spreader 512 according to an embodiment. The heat sink 512 is depicted generically. In one embodiment, the heat sink 512 is a heat pipe. In one embodiment, the heat sink 512 is a heat slug. In one embodiment, the heat sink 512 is an IHS.

Together, the container barrier 510 and the heat sink 512 form a recess 514. In one embodiment, the container barrier 510 is referred to as an o-ring 510. In one embodiment, a liquid heat-transfer medium 516 is disposed in the recess 514. A first container-barrier heat transfer-medium access 517 is disposed in the container-barrier 510. The container-barrier heat transfer-medium access 517 is also referred to as a first channel through the container barrier. Several materials can be used as the liquid heat-transfer medium 516, including those referred to the several embodiments, separately, or in combination as set forth above in relation to FIG. 1.

In one embodiment, the first heat transfer-medium access 517 is used for filling a liquified heat transfer medium through the first container-barrier heat transfer-medium access 517. In other embodiments, however, a substantially solid material is placed into the recess 514 before assembly, and the liquid heat-transfer medium 516 melts upon operational heating of the die. Outgassing of the liquid heat-transfer medium 516 can be done by a plug 540.

Figure 6:
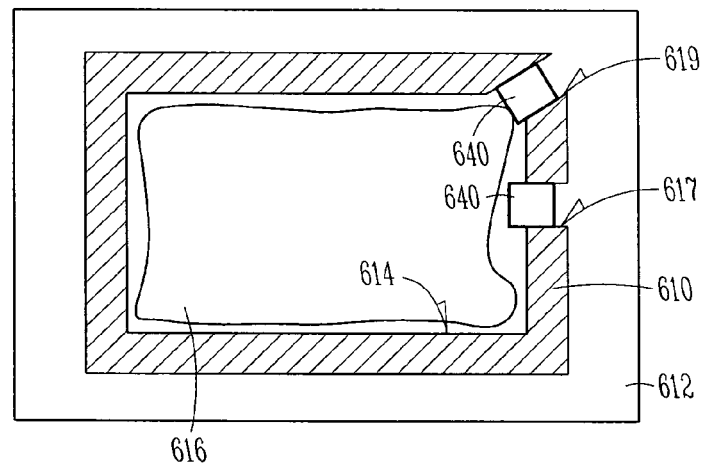
FIG. 6 is a bottom cross-section of a container barrier and a heat sink according to an embodiment.

FIG. 6 is a bottom cross-section of a container barrier 610 and a heat sink 612 according to an embodiment. The heat sink 612 is depicted generically. In one embodiment, the heat sink 612 is a heat pipe. In one embodiment, the heat sink 612 is a heat slug. In one embodiment, the heat sink 612 is an IHS.

Together, the container barrier 610 and the heat sink 612 form a recess 614. In one embodiment, a liquid heat-transfer medium 616 is disposed in the recess 614. A first container-barrier heat transfer-medium access 617 is disposed in the container-barrier 610. The first container-barrier heat transfer-medium access 617 is also referred to as a first channel through the container barrier. Additionally, a second container-barrier heat transfer-medium access 619 is disposed in the container-barrier 610. The second container-barrier heat transfer-medium access 619 is also referred to as a second channel through the container barrier. Several materials can be used as the liquid heat-transfer medium 616, including those referred to the several embodiments, separately, or in combination as set forth above in relation to FIG. 1.

In one embodiment, first and second container-barrier heat transfer-medium accesses 617 and 619, respectively, are used to pump or draw, or both, the liquid heat-transfer medium 616 into the recess 614. Thereafter, at least one of the first and second container-barrier heat transfer-medium accesses 617 and 619 can be sealed. In one embodiment, one access is sealed and the other is plugged with a plug 640 such as the plug 140 depicted in FIG. 1.

In other embodiments, however, a substantially solid material is placed into the recess 614 before assembly, and the liquid heat-transfer medium 616 melts upon heating. Outgassing of the liquid heat-transfer medium 616 can be done by a plug (not pictured) such as the plug 140 depicted in FIG. 1.

Figure 7:
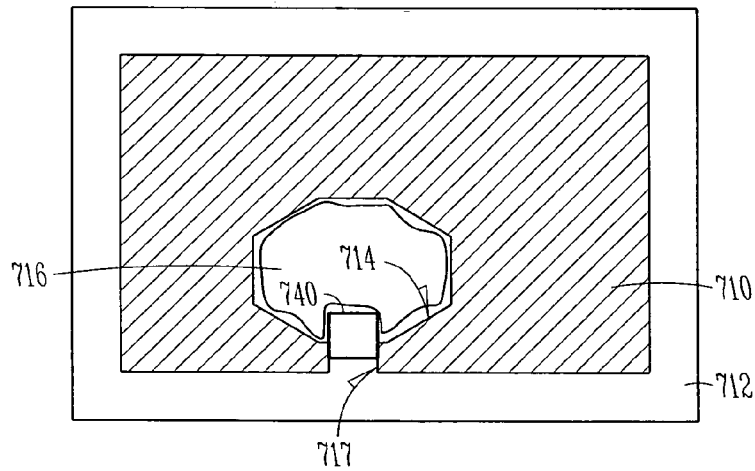
FIG. 7 is a bottom cross-section of a container barrier and a heat sink according to an embodiment.

FIG. 7 is a bottom cross-section of a container barrier 710 and a heat sink 712 according to an embodiment. The heat sink 712 is depicted generically. In one embodiment, the heat sink 712 is a heat pipe. In one embodiment, the heat sink 712 is a heat slug. In one embodiment, the heat sink 712 is an IHS.

Together, the container barrier 710 and the heat sink 712 form a recess 714. In one embodiment, a liquid heat-transfer medium 716 is disposed in the recess 714. A first container-barrier heat transfer-medium access 717 is disposed in the container-barrier 710. The first container-barrier heat transfer-medium access 717 is also referred to as a first channel through the container barrier. Outgassing of the liquid heat-transfer medium 716 can be facilitated by a gas-permeable plug 740.

Several materials can be used as the liquid heat-transfer medium 716, including those referred to the several embodiments, separately, or in combination as set forth above in relation to FIG. 1.

FIG. 7 depicts a region in the container barrier 710 that includes a region (the recess 714) that is a localized concentration region 714 of the liquid heat-transfer medium 716. In the concentration region 714, a higher heat transfer is facilitated through the liquid heat-transfer medium 716, but a higher adhesion elsewhere for the container barrier 710 is facilitated, both to the heat sink 712 and to a die (not pictured). In one embodiment, the concentration region 714 is configured to be located proximate an excessively hot region of a die to facilitate heat removal. For example, a level zero cache ("L0 cache") can be located on a die that has a high frequency of access and accompanying heat generation. By concentrating more of the liquid heat-transfer medium 716 in a concentration region 714 that will be aligned with a die at a more active region, a more efficient heat transfer conduit is provided, but adhesion of the container barrier 710 to a die and the heat sink 712 is not compromised, due to a sufficient amount of the container barrier 710 that is adhering to the die. This larger heat transfer capability in the concentration region 714 represents a lowered resistance to heat flow between the heat-generating die and the heat-removing heat sink.

Various vertical structure embodiments are set forth for the container barriers that have been depicted in this disclosure. In some embodiments, the container barrier is stratified to achieve a selected adhesion to a given die, whether it is clad or not, and to achieve a selected adhesion to a given heat sink, whether it is clad or not. In FIG. 1, a closed-loop section line 8 is depicted that is the generic cross-section for the specific embodiments set forth subsequently in this disclosure.

In one embodiment, the container barrier is a metal. The metal is a material with an adhesion to a heat sink and a die, whether they are bare, one is clad, or both are clad, but the metal has a melting point significantly higher than the liquid heat-transfer medium. In one embodiment, the metal is a solder. In one embodiment, the metal is a leaded solder. In one embodiment, the metal is a conventional lead-free solder. In one embodiment, the metal is a reactive solder.

In one embodiment, a reactive solder system is used. A reactive solder material includes properties that allow for adhesive and/or heat-transfer qualities. For example, the reactive solder material can melt and resolidify without a pre-flux cleaning. Further, a reactive solder embodiment can also include bonding without a metal surface. Without the need of a metal surface for bonding, processing can be simplified.

In one embodiment, a reactive solder includes a base solder that is alloyed with an active element material. In one embodiment, a base solder is indium. In one embodiment, a base solder is tin. In one embodiment, a base solder is silver.

In one embodiment, a base solder is tin-silver. In one embodiment, a base solder is at least one lower-melting-point metal with any of the above base solders. In one embodiment, a base solder is a combination of at least two of the above base solders. Additionally, conventional lower-melting-point metals/alloys can be used.

The active element material is alloyed with the base solder. In one embodiment, the active element material is provided in a range from about 2% to about 30% of the total solder. In one embodiment, the active element material is provided in a range from about 2% to about 10%. In one embodiment, the active element material is provided in a range from about 0.1% to about 2%.

Various elements can be used as the active element material. In one embodiment, the active element material is selected from hafnium, cerium, lutetium, other rare earth elements, and combinations thereof. In one embodiment, the active element material is a refractory metal selected from titanium, tantalum, niobium, and combinations thereof. In one embodiment, the active element material is a transition metal selected from nickel, cobalt, palladium, and combinations thereof. In one embodiment, the active element material is selected from copper, iron, and combinations thereof. In one embodiment, the active element material is selected from magnesium, strontium, cadmium, and combinations thereof.

The active element material, when alloyed with the base solder, can cause the alloy to become reactive with a semiconductive material such as the backside surface of a die. The alloy can also become reactive with an oxide layer of a semiconductive material such as silicon oxide, gallium arsenide oxide, and the like. The alloy can also become reactive with a nitride layer of a semiconductive material such as silicon nitride, silicon oxynitride, gallium arsenide nitride, gallium arsenide oxynitride, and the like.

According to an embodiment, the container barrier includes a solder that contains lead (Pb) or a substantially Pb-free solder. By "substantially Pb-free solder," it is meant that the solder is not designed with Pb content according to industry trends. A substantially Pb-free solder in one embodiment includes a SnAgCu solder as is known in the art.

One example of a Pb-containing solder includes a tin-lead solder. In selected embodiments, Pb-containing solder is a tin-lead solder composition such as from 97% tin (Sn)/3% lead (Sn3Pb). A tin-lead solder composition that may be used is a Sn63Pb composition of 37% tin/63% lead. In any event, the Pb-containing solder may be a tin-lead solder comprising $Sn_xPb_y$, wherein x+y total 1, and wherein x is in a range from about 0.3 to about 0.99. In one embodiment, the Pb-containing solder is a tin-lead solder composition of Sn3Pb. In one embodiment, the Pb-containing solder is a tin-lead solder composition of Sn63Pb.

FIG. 8A is a side cross-section of a container barrier subsystem 800 according to an embodiment. The structure of the container barrier subsystem 800 is taken from the section 8 in FIG. 1. The container barrier subsystem 800 is applicable to various chip packaging systems according to embodiments set forth herein and their art-recognized equivalents.

According to various embodiments, the container barrier subsystem 800 is a combination of a plurality of first heat transfer structures 850 and a second heat transfer structure 852 that acts as a matrix for the plurality of first heat transfer structures 850. The plurality of first heat transfer structures 850 and the second heat transfer structure 852 are also referred to a container barrier preform. A solder preform 854 completes the container barrier subsystem 800. In one embodiment, the container barrier subsystem 800 includes a polymer matrix for the second heat transfer structure 852, and a metal or alloy for the plurality of first heat transfer structures 850. The matrix of the second heat transfer structure 852 is to be adhered to a material such as the backside surface of a die.

The plurality of first heat transfer structures 850 is used to increase the average heat transfer coefficient through the matrix of the second heat transfer structure 852. In another embodiment that relates to the thermal interface either alone, or applied in a chip package, the plurality of first heat transfer structures 850 is present in relation to the second heat transfer structure 852 in a volume range from about 0.1% to about 5%. In another embodiment, the plurality of first heat transfer structures 850 is present in relation to the second heat transfer structure 852 in a volume range from about 0% to about 0.1%. In another embodiment, the plurality of first heat transfer structures 850 is present in relation to the second heat transfer structure 852 in a volume range from about 0% to about 100%. In another embodiment, the plurality of first heat transfer structures 850 is present in relation to the second heat transfer structure 852 in a volume range from about 2% to about 10%.

In one embodiment, the plurality of first heat transfer structures 850 has a coefficient of thermal conductivity in a range from about 90 Watt per meter degree Kelvin (W/m-K) to about 700 W/m-K. The plurality of first heat transfer structures 850 is depicted as uniformly dispersed in the matrix of the second heat transfer structure 852. The plurality of first heat transfer structures 850 is depicted as arranged in a pattern, but this pattern is only one embodiment, as other arrangements can be implemented including random dispersion. Further, the plurality of first heat transfer structures 850 is not necessarily drawn to scale. In one embodiment, the container barrier subsystem 800 depicted in FIG. 8A is a smaller section taken from a larger article. In one embodiment, the diameter (or the characteristic dimension) of a given first heat transfer structure 850 is in a range from about 1 μm to about 1,000 μm.

In one embodiment, the container barrier subsystem 800 has a thickness in a range from about 0.1 mil to about 100 ml. Although the plurality of first heat transfer structures 850 is depicted as spaced apart in the matrix that is the second heat transfer structure 852, in one embodiment, the plurality of first heat transfer structures 850 can be touching each other in a close-packed configuration, and the second heat transfer structure 852 acts as an interstitial matrix.

In one embodiment, the second heat transfer structure 852 that forms the matrix for the plurality of first heat transfer structures 850 is a metal alloy with a coefficient of thermal conductivity in a range from about 30 W/m-K to about 90 W/m-K. A metal alloy second heat transfer structure 852 is useful for bonding to a plated die such as a gold-plated die. In one embodiment, the second heat transfer structure 852 is a polymer, and the first heat transfer structure 850 is a metal or a metal alloy. In one embodiment, the first heat transfer structure 850 is indium (In) and the second heat transfer structure 852 is a polymer. In one embodiment, the first heat transfer structure 850 is an indium-tin (InSn) alloy, and the second heat transfer structure 852 is a polymer. In one embodiment, the first heat transfer structure 850 is tin, and the second heat transfer structure 852 is a polymer. In one embodiment, the first heat transfer structure 850 is an indium-silver (InAg) alloy, and the second heat transfer structure 852 is a polymer. In one embodiment, the first heat transfer structure 850 is a tin-silver (SnAg) alloy, and the second heat transfer structure 852 is a polymer. In one embodiment, the first heat transfer structure 850 is a tin-silver-copper (SnAgCu) alloy, and the second heat transfer structure 852 is a polymer.

In one embodiment, the second heat transfer structure 852 is a metal or metal alloy, and the first heat transfer structure 850 is a particulate such as graphite fiber, or diamond powder. In one embodiment, the first heat transfer structure 850 is indium, and the second heat transfer structure 852 is a particulate such as graphite fiber, or diamond powder. In one embodiment, the first heat transfer structure 850 is an indium-tin alloy, and the second heat transfer structure 852 is a particulate such as graphite fiber or diamond powder. In one embodiment, the first heat transfer structure 850 is tin, and the second heat transfer structure 852 is a particulate such as graphite fiber or diamond powder. In one embodiment, the first heat transfer structure 850 is an indium-silver alloy, and the second heat transfer structure 852 is a particulate such as graphite fiber, or diamond powder. In one embodiment, the first heat transfer structure 850 is a tin-silver alloy, and the second heat transfer structure 852 is a particulate such as graphite fiber, or diamond powder. In one embodiment, the first heat transfer structure 850 is a tin-silver-copper alloy, and the second heat transfer structure 852 is a particulate such as graphite fiber or diamond powder.

In one embodiment, the solder preform 854 is a metal or metal alloy that adheres to a heat sink such as a heat slug, a heat pipe, an IHS or a metal-clad IHS. In one embodiment, the solder preform 854 is an indium material. In one embodiment, the solder preform 854 is an indium-tin material. In one embodiment, the solder preform 854 is a tin material. In one embodiment, the solder preform 854 is an indium-silver material. In one embodiment, the solder preform 854 is a tin-silver material. In one embodiment, the solder preform 854 is a tin-silver-indium material.

In one embodiment, the plurality of first heat transfer structures 850 includes high-thermal conductivity fibers such as metal filaments. In one embodiment, the plurality of first heat transfer structures 850 represents high-thermal conductivity fibers such as glass fibers. In one embodiment, the plurality of first heat transfer structures 850 represents high-thermal conductivity fibers that include graphite fibers. In one embodiment, the plurality of first heat transfer structures 850 represents high-thermal conductivity fibers that include graphite fibers and metal filaments. In one embodiment, the plurality of first heat transfer structures 850 represents high-thermal conductivity fibers that include graphite fibers and glass fibers. In one embodiment, the plurality of first heat transfer structures 850 represents high-thermal conductivity fibers that include metal filaments and glass fibers. In one embodiment, all three of metal, glass, and graphite fibers are included. Various article qualities can be achieved by selecting at least one of a graphite, metal, and glass fiber and fixing at lest one of them in a second heat transfer structure 852 such as the matrix depicted in FIG. 8A.

In one embodiment, the matrix of the second heat transfer structure 852 is an organic matrix such as a polymer that has a high adhesion to bare die such as bare monocrystalline silicon.

The plurality of first heat transfer structures 850 and the second heat transfer structure 852 form a first heat transfer composite shape that in one embodiment is a polymer-solder hybrid (PSH). In one embodiment, the first heat transfer composite shape is severed from a supply stock that has been either continuously, semi-continuously, or batch processed.

When the first heat transfer composite shape is therefore viewed as depicted in FIG. 8A, and after a portion has been severed, it is coupled with a solder preform 854 that is the container barrier subsystem 800.

FIG. 8B is a depiction of the container barrier subsystem 800 in FIG. 8A as a container barrier composite 801 after processing. An interface 802 has been accomplished that acts to blend the matrix of the second heat transfer structure 852 and the solder preform 854. The interface 802 is represented in as an arbitrary shape and expanse. In one embodiment, the matrix of the second heat transfer structure 852 and the solder preform 854 are substantially blended, such that a solder-rich zone 854 overlaps into a polymer-rich zone 852. In one embodiment, the respective zones are further blended until a solder-rich gradient 854 is detectable with a diminishing solder concentration, as it blends into a polymer-rich gradient 852 with an increasing polymer concentration.

Processing to achieve the interface 802 for the container barrier composite 801 can be done by various operations. In one embodiment, the solder preform 854 and the second heat transfer structure 852 are pressed under a heat load. In one embodiment, the solder preform 854 and the second heat transfer structure 852 are cold stamped. By "cold stamped" it is meant that cold forming of the container barrier is carried out. Cold forming includes working the material below its melting temperature.

FIG. 9A is a side cross-section of a container barrier subsystem 900 according to an embodiment. The structure of the container barrier subsystem 900 is taken from the section 8 in FIG. 1. The container barrier subsystem 900 is applicable to various chip packaging systems according to embodiments set forth herein and their art-recognized equivalents.

According to the various embodiments set forth in this disclosure for a container barrier subsystem, the container barrier subsystem 900 includes a plurality of first heat transfer structures 950 and a second heat transfer structure 952. Additionally, a plurality of first particulates 951 is interspersed within the second heat transfer structure 952.

In one embodiment, the second heat transfer structure 952 that forms the matrix for the plurality of first heat transfer structures 950 is a metal alloy according to various embodiment set forth herein.

In one embodiment, the second heat transfer structure 952 is an organic composition according to various embodiment set forth herein. In one embodiment, the second heat transfer structure 952 that forms the matrix for the plurality of first heat transfer structures 950 is a metal alloy according to various embodiments set forth herein. In one embodiment, the second heat transfer structure 952 is an organic composition according to various embodiments set forth herein. In one embodiment, the second heat transfer structure 952 that forms the matrix for the plurality of first heat transfer structures 950 is a metal alloy with a coefficient of thermal conductivity in a range from about 30 W/m-K to about 90 W/m-K. In one embodiment, the second heat transfer structure 952 is an organic composition such as a high thermal conductivity polymer with a coefficient of thermal conductivity in a range from about 0.1 W/m-K to about 1 W/m-K.

In one embodiment, the plurality of first particulates 951 includes inorganics that are metallic in an organic matrix of the second heat transfer structure 952. In this embodiment, the overall coefficient of thermal conductivity for the container barrier subsystem 900 is in a range from about 0.1 W/m-K to less than or equal to about 600 W/m-K.

In one embodiment, the plurality of first particulates 951 includes inorganics that are metallic in a metallic matrix of the second heat transfer structure 952. In this embodiment, the overall coefficient of thermal conductivity for the container barrier subsystem 900 is in a range from about 20 W/m-K to less than or equal to about 600 W/m-K.

In one embodiment, the plurality of first particulates 951 includes inorganics that are dielectrics in an organic matrix of the second heat transfer structure 952. In this embodiment, the overall coefficient of thermal conductivity for the container barrier subsystem 900 is in a range from about 10 W/m-K to about 90 W/m-K.

In one embodiment, the plurality of first particulates 951 includes inorganics that are dielectrics in a metallic matrix of the second heat transfer structure 952. In this embodiment, the overall coefficient of thermal conductivity for the container barrier subsystem 900 is in a range from about 20 W/m-K to less than or equal to about 600 W/m-K.

Although the plurality of first particulates 951 is depicted as angular and eccentric shapes, in one embodiment, the plurality of first particulates 951 can be other shapes. In one embodiment, the plurality of first particulates 951 includes a substantially spherical powder that has an average diameter in a range from about 0.1 micron to about 10 micron. In one embodiment, the eccentricity of the particulates 951, as measured by a ratio of the major diagonal axis to the minor diagonal axis, is in a range from about 1 to about 10. In one embodiment, the eccentricity is greater than 10.

The combination of the plurality of first heat transfer structures 950, the second heat transfer structure 952, and the plurality of first particulates 951 presents a conglomerate channel from one surface of the second heat transfer structure 952 to an opposite surface thereof. As such, heat transfer through the matrix is expedited.

FIG. 9B is a depiction of the container barrier subsystem 900 in FIG. 9A as a container barrier composite 901 after processing. An interface 902 has been accomplished that blends the matrix of the second heat transfer structure 952 and the solder preform 954. The interface 902 is represented as an arbitrary shape and expanse. In one embodiment, the matrix of the second heat transfer structure 952 and the solder preform 954 are substantially blended, such that a solder-rich zone 954 overlaps into a polymer-rich zone 952. In one embodiment, the respective zones are further blended until a solder-rich gradient 954 is detectable with a diminishing solder concentration, as it blends into a polymer-rich gradient 952 with an increasing polymer concentration.

Processing to achieve the interface 902 for the container barrier composite 901 can be done by various operations. In one embodiment, the solder preform 954 and the second heat transfer structure 952 are pressed under a heat load. In one embodiment, the solder preform 954 and the second heat transfer structure 952 are cold stamped.

FIG. 10A is a side cross-section of a container barrier subsystem 1000 according to an embodiment. The structure of the container barrier subsystem 1000 is taken from the section 8 in FIG. 1. The container barrier subsystem 1000 is depicted that is applicable to various chip packaging systems according to embodiments set forth herein and their art-recognized equivalents.

According to the various embodiments set forth in this disclosure for the container barrier subsystems, the container barrier subsystem 1000 includes a plurality of first heat transfer structures 1050 and a second heat transfer structure 1052 that acts as a matrix for the plurality of first heat transfer structures 1050. A plurality of first particulates 1051 is interspersed within the second heat transfer structure 1052. Additionally, a plurality of second particulates 1053 is also interspersed within the second heat transfer structure 1052. Similar to the plurality of first particulates 1051, the plurality of second particulates 1053 has an eccentricity ratio. The two eccentricity ratios can be related or they can be independent of each other.

In one embodiment, the second heat transfer structure 1052 that forms the matrix for the plurality of first heat transfer structures 1050 is a metal alloy according to various embodiments set forth herein. In one embodiment, the second heat transfer structure 1052 is an organic composition according to various embodiments set forth herein.

In one embodiment, the plurality of first particulates 1051 is a first metal, and the plurality of second particulates 1053 is a second metal. In this embodiment, the overall coefficient of thermal conductivity for the container barrier subsystem 1000 is in a range from about 20 W/m-K to less than or equal to about 600 W/m-K.

In one embodiment, the plurality of first particulates 1051 is a first dielectric, and the plurality of second particulates 1053 is a second dielectric. In this embodiment, the overall coefficient of thermal conductivity for the container barrier subsystem 1000 is in a range from about 5 W/m-K to less than or equal to about 600 W/m-K.

In one embodiment, the plurality of first particulates 1051 is a dielectric, and the plurality of second particulates 1053 is a metal. In this embodiment, the overall coefficient of thermal conductivity for the container barrier subsystem 1000 is in a range from about 20 W/m-K to less than or equal to about 600 W/m-K.

In one embodiment, the plurality of first particulates 1051 is a metal, and the plurality of second particulates 1053 is a dielectric. In this embodiment, the overall coefficient of thermal conductivity for the container barrier subsystem 1000 is in a range from about 20 W/m-K to less than or equal to about 600 W/m-K.

Although the shapes for the plurality of first particulates 1051 and the plurality of second particulates 1053 are respectively depicted as eccentric and round, these shapes are depicted to distinguish the two particulate types.

The combination of the plurality of first heat transfer structures 1050, the second heat transfer structure 1052, the plurality of first particulates 1051, and the plurality of second particulates 1053 presents a conglomerate channel from one surface of the second heat transfer structure 1052 to an opposite surface thereof. As such, heat transfer through the matrix is expedited.

FIG. 10B is a depiction of the container barrier subsystem 1000 in FIG. 10A as a container barrier composite 1001 after processing. An interface 1002 has been accomplished that blends the matrix of the second heat transfer structure 1052 and the solder preform 1054. The interface 1002 is represented as an arbitrary shape and expanse. In one embodiment, the matrix of the second heat transfer structure 1052 and the solder preform 1054 are substantially blended, such that a solder-rich zone 1054 overlaps into a polymer-rich zone 1052. In one embodiment, the respective zones are further blended until a solder-rich gradient 1054 is detectable with a diminishing solder concentration, as it blends into a polymer-rich gradient 1052 with an increasing concentration.

Processing to achieve the interface 1002 for the container barrier composite 1001 can be done by various operations. In one embodiment, the solder preform 1054 and the second heat transfer structure 1052 are pressed under a heat load. In one embodiment, the solder preform 1054 and the second heat transfer structure 1052 are cold stamped.

Figure 11A:
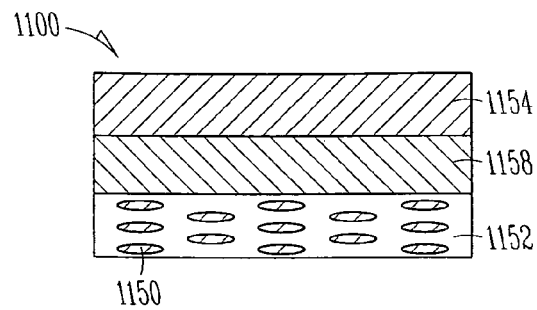
FIG. 11A is a side cross-section of a container barrier subsystem according to an embodiment.

FIG. 11A is a side cross-section of a container barrier subsystem 1100 according to an embodiment. The structure of the container barrier subsystem 1100 is taken from the section 8 in FIG. 1. The container barrier subsystem 1100 is applicable to various chip packaging systems according to embodiments set forth herein and their art-recognized equivalents.

According to the various embodiments set forth in this disclosure, the container barrier subsystem 1100 includes a combination of a plurality of first heat transfer structures 1150 and a second heat transfer structure 1152 that acts as a matrix for the plurality of first heat transfer structures 1150. The second heat transfer structure 1152 is built upon with a solder preform 1154 and a middle heat transfer structure 1158. The middle heat transfer structure 1158 includes a combination of materials that approaches a discrete approximation between the material of the solder preform 1154, and the blended materials of the first heat transfer structure 1150 and the matrix of the second heat transfer structure 1152.

Figure 11B:
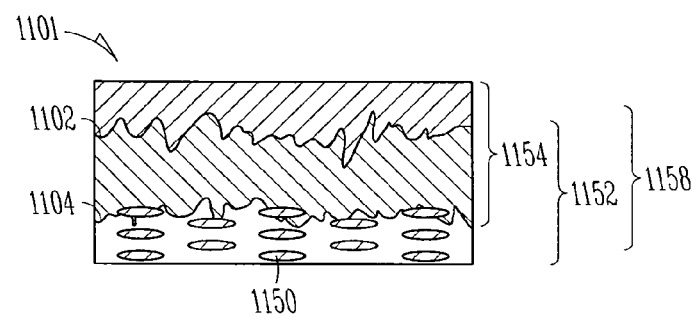
FIG. 11B depicts the container barrier composite in FIG. 5A after further processing.

FIG. 11B is a depiction of the container barrier subsystem 1100 in FIG. 11A as a container barrier composite 1101 after processing. A first interface 1102 has been accomplished that blends the solder preform 1154 with the middle heat transfer structure 1158. The first interface 1102 is represented as an arbitrary shape and expanse. In one embodiment, the solder preform 1154 and the middle heat transfer structure 1158 are substantially blended, such that a solder-rich zone 1154 overlaps by a decreasing solder concentration gradient into a polymer-solder zone 1158. A second interface 1104 has been accomplished that blends the middle heat transfer structure 1158 with the matrix of the second heat transfer structure 1152. In one embodiment, the matrix of the second heat transfer structure 1152 and the middle heat transfer structure 1158 are substantially blended, such that a solder-polymer zone 1158 overlaps into a polymer-rich zone 1152. In one embodiment, the respective zones are further blended until a solder-polymer concentration gradient 1158 is detectable with a diminishing solder concentration, as it blends into a polymer-rich gradient 1152 with an increasing polymer concentration.

Processing to achieve the interfaces 1102 and 1104 for the container barrier composite 1101 can be done by various operations. In one embodiment, the solder preform 1154, the middle heat transfer structure 1158, and the matrix of the second heat transfer structure 1152 are pressed under a heat load. In one embodiment, these structures are cold stamped.

Figure 12A:
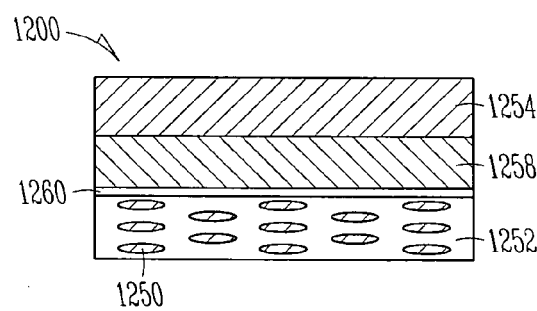
FIG. 12A is a side cross-section of a container barrier subsystem according to an embodiment.

FIG. 12A is a side cross-section of a container barrier subsystem 1200 according to an embodiment. The structure of the container barrier subsystem 1200 is taken from the section 8 in FIG. 1. The container barrier subsystem 1200 is applicable to various chip packaging systems according to embodiments set forth herein and their art-recognized equivalents.

According to the various embodiments set forth in this disclosure, the container barrier subsystem 1200 includes a combination of a plurality of first heat transfer structures 1250 and a second heat transfer structure 1252 that acts as a matrix for the plurality of first heat transfer structures 1250. The second heat transfer structure 1252 is built upon with a solder preform 1254 and a middle heat transfer structure 1258. The middle heat transfer structure 1258 includes a combination of materials that approaches a discrete approximation between the material of the solder preform 1254, and the blended materials of the first heat transfer structure 1250 and the matrix of the second heat transfer structure 1252.

Figure 12B:
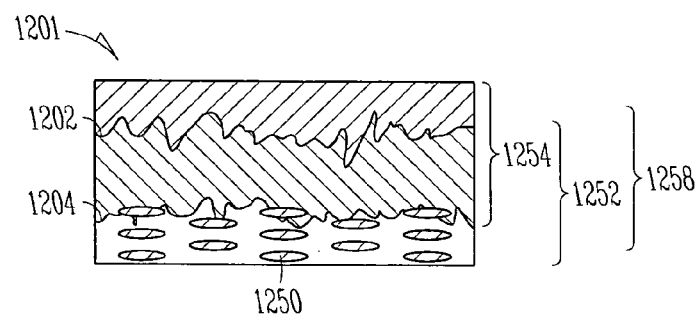
FIG. 12B depicts the container barrier subsystem composite in FIG. 6A after further processing.

In this embodiment, a lower tie layer 1260 is disposed between the second heat transfer structure 1252 and the middle heat transfer structure 1258. The lower tie layer 1260 facilitates an intermediate structure that in one embodiment acts as an adhesive for the intermediate structure during processing. In one embodiment, the lower tie layer 1260 is an organic adhesive that becomes a fugitive material during heated processing. In one embodiment, the lower tie layer 1260 is an organic adhesive that remains in the container barrier composite 1201 (FIG. 12B). In one embodiment, the lower tie layer 1260 is a metal such as a solder that facilitates wetting during processing.

FIG. 12B is a depiction of the container barrier subsystem 1200 in FIG. 12A as a container barrier composite 1201 after processing. A first interface 1202 has been accomplished that blends the solder preform 1254 with the middle heat transfer structure 1258. The first interface 1202 is represented as an arbitrary shape and expanse. In one embodiment, the solder preform 1254 and the middle heat transfer structure 1258 are substantially blended, such that a solder-rich zone 1254 overlaps by a decreasing solder concentration gradient into a polymer-solder zone 1258. A second interface 1204 has been accomplished that blends the middle heat transfer structure 1258 with the matrix of the second heat transfer structure 1252. In one embodiment, the matrix of the second heat transfer structure 1252 and the middle heat transfer structure 1252 are substantially blended, such that a solder-polymer 1258 overlaps into a polymer-rich zone 1252. In one embodiment, the respective zones are further blended until a solder-polymer concentration gradient 1258 is detectable with a diminishing solder concentration, as it blends into a polymer-rich gradient 1252 with an increasing polymer concentration.

Processing to achieve the interfaces 1202 and 1204 for the container barrier composite 1201 can be done by various operations. In one embodiment, the solder preform 1254, the middle heat transfer structure 1258, and the matrix of the second heat transfer structure 1252 are pressed under a heat load. In one embodiment, these structures are cold stamped. The first tie layer 1260 is not depicted in FIG. 12B as it is either driven out under a heat load in one embodiment, or it is substantially mixed into the container barrier composite 1201 in another embodiment.

Figure 13A:
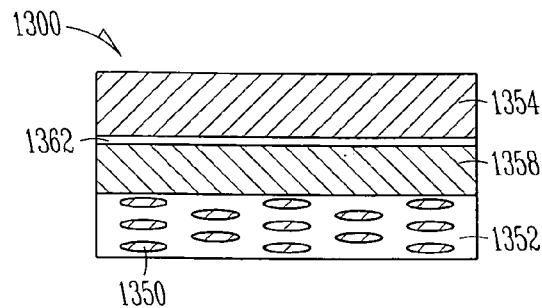
FIG. 13A is a side cross-section of a container barrier subsystem according to an embodiment.

FIG. 13A is a side cross-section of a container barrier subsystem 1300 according to an embodiment. The structure of the container barrier subsystem 1300 is taken from the section 8 in FIG. 1. The container barrier subsystem 1300 is applicable to various chip packaging systems according to embodiments set forth herein and their art-recognized equivalents.

According to the various embodiments set forth in this disclosure, the container barrier subsystem 1300 includes a combination of a plurality of first heat transfer structures 1350 and a second heat transfer structure 1352 that acts as a matrix for the plurality of first heat transfer structures 1350. The second heat transfer structure 1352 is built upon with a solder preform 1354 and a middle heat transfer structure 1358. The middle heat transfer structure 1358 includes a combination of materials that approaches a discrete approximation between the material of the solder preform 1354, and the blended materials of the first heat transfer structure 1350 and the matrix of the second heat transfer structure 1352.

Figure 13B:
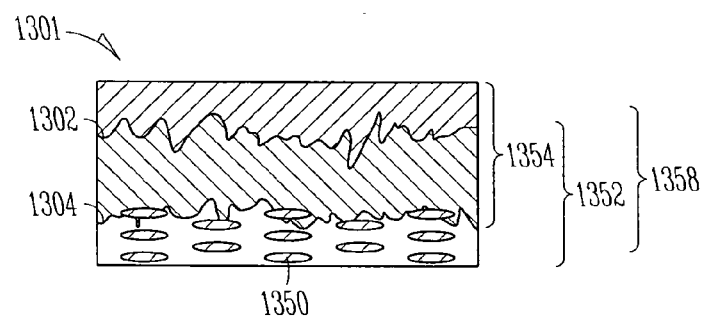
FIG. 13B depicts the container barrier composite in FIG. 13A after further processing.

In this embodiment, an upper tie layer 1362 is disposed between the solder preform 1354 and the middle heat transfer structure 1358. The upper tie layer 1362 facilitates an intermediate structure 1300 that in one embodiment acts as an adhesive for the intermediate structure 1300 during processing. In one embodiment, the upper tie layer 1362 is an organic adhesive that becomes a fugitive material during heated processing. In one embodiment, the upper tie layer 1362 is an organic adhesive that remains in the container barrier subsystem composite 1301 (FIG. 13B). In one embodiment, the upper tie layer 1362 is a metal such as a solder that facilitates wetting during processing.

FIG. 13B is a depiction of the container barrier subsystem 1300 in FIG. 13A as a container barrier composite 1301 after further processing. A first interface 1302 has been accomplished that blends the solder preform 1354 with the middle heat transfer structure 1358. The first interface 1302 is represented as an arbitrary shape and expanse. In one embodiment, the solder preform 1354 and the middle heat transfer structure 1358 are substantially blended, such that a solder-rich zone 1354 overlaps by a decreasing solder concentration gradient into a polymer-solder zone 1358. A second interface 1304 has been accomplished that blends the middle heat transfer structure 1358 with the matrix of the second heat transfer structure 1352. In one embodiment, the matrix of the second heat transfer structure 1352 and the middle heat transfer structure 1358 are substantially blended, such that a solder-polymer zone 1358 overlaps into a polymer-rich zone 1352. In one embodiment, the respective zones are further blended until a solder-polymer concentration gradient 1358 is detectable with a diminishing solder concentration, as it blends into a polymer-rich gradient 1352 with an increasing polymer concentration.

Processing to achieve the interfaces 1302 and 1304 for the container barrier subsystem composite 1301 can be done by various operations. In one embodiment, the solder preform 1354, the middle heat transfer structure 1358, and the matrix of the second heat transfer structure 1352 are pressed under a heat load. In one embodiment, these structures are cold stamped. The upper tie layer 1362 is not depicted in FIG. 13B as it is either driven out under a heat load in one embodiment, or it is substantially mixed into the heat transfer composite 1301 in another embodiment.

Figure 14A:
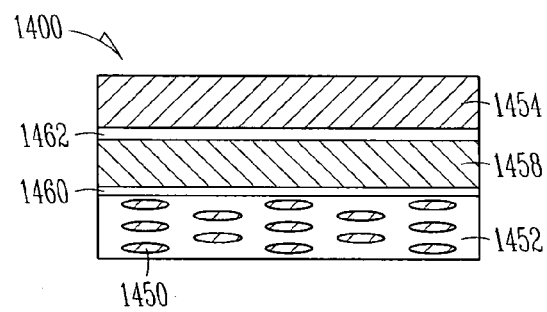
FIG. 14A is a side cross-section of a container barrier subsystem according to an embodiment.

FIG. 14A is a side cross-section of a container barrier subsystem 1400 according to an embodiment. The structure of the container barrier subsystem 1400 is taken from the section 8 in FIG. 1. The container barrier subsystem 1400 is applicable to various chip packaging systems according to embodiments set forth herein and their art-recognized equivalents.

According to the various embodiments set forth in this disclosure, the container barrier subsystem 1400 includes a combination of a plurality of first heat transfer structures 1450 and a second heat transfer structure 1452 that acts as a matrix for the plurality of first heat transfer structures 1450. The second heat transfer structure 1452 is built upon with a solder preform 1454 and a middle heat transfer structure 1458. The middle heat transfer structure 1458 includes a combination of materials that approaches a discrete approximation between the material of the solder preform 1454, and the blended materials of the first heat transfer structure 1450 and the matrix of the second heat transfer structure 1452.

In this embodiment, an upper tie layer 1462 is disposed between the solder preform 1454 and the middle heat transfer structure 1458. Additionally, a lower tie layer 1460 is disposed between the second heat transfer structure 1452 and the middle heat transfer structure 1458. The respective upper and lower tie layers 1462 and 1460 facilitate an intermediate structure 1400 that in one embodiment, each acts as an adhesive as set forth in this disclosure. In one embodiment, the upper tie layer 1462 is an organic adhesive, and the lower tie layer 1460 is an organic adhesive. In one embodiment, the upper tie layer 1462 is an organic adhesive, and the lower tie layer 1460 is a metallic material. In one embodiment, the upper tie layer 1462 is a metallic material, and the lower tie layer 1460 is an organic adhesive. In one embodiment, the upper tie layer 1462 is a metallic material, and the lower tie layer 1460 is a metallic material.

Figure 14B:
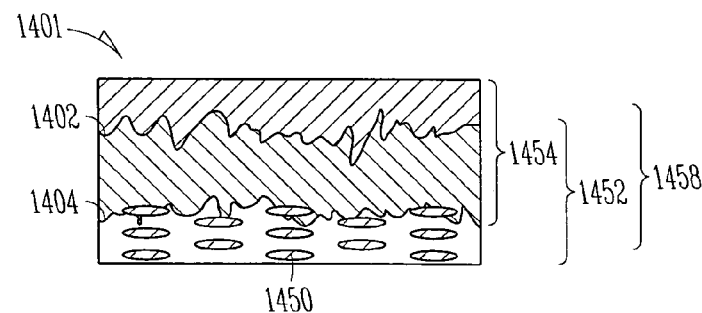
FIG. 14B depicts the container barrier composite in FIG. 7A after further processing.

FIG. 14B is a depiction of the container barrier subsystem 1400 in FIG. 14A as a container barrier composite 1401 after further processing. A first interface 1402 has been accomplished that blends the solder preform 1454 with the middle heat transfer structure 1458. The first interface 1402 is represented as an arbitrary shape and expanse. In one embodiment, the solder preform 1454 and the middle heat transfer structure 1458 are substantially blended, such that a solder-rich zone 1454 overlaps by a decreasing solder concentration gradient into a polymer-solder zone 1458. A second interface 1404 has been accomplished that blends the middle heat transfer structure 1458 with the matrix of the second heat transfer structure 1452. In one embodiment, the matrix of the second heat transfer structure 1452 and the middle heat transfer structure 1458 are substantially blended, such that a solder-lean, polymer-lean zone 1454 overlaps into a polymer-rich zone 1452. In one embodiment, the respective zones are further blended until a solder-polymer concentration gradient 1458 is detectable with a diminishing solder concentration, as it blends into a polymer-rich gradient 1452 with an increasing polymer concentration.

Processing to achieve the interfaces 1402 and 1404 for the heat transfer composite 1401 can be done by various operations. In one embodiment, the solder preform 1454, the middle heat transfer structure 1458, and the matrix of the second heat transfer structure 1452 are pressed under a heat load. In one embodiment, these structures are cold stamped. The upper and lower tie layers 1462 and 1460, respectively, are not depicted in FIG. 14B as they are either driven out under a heat load in one embodiment, or they are substantially mixed into the heat transfer composite 1401 in another embodiment.

Figure 15:
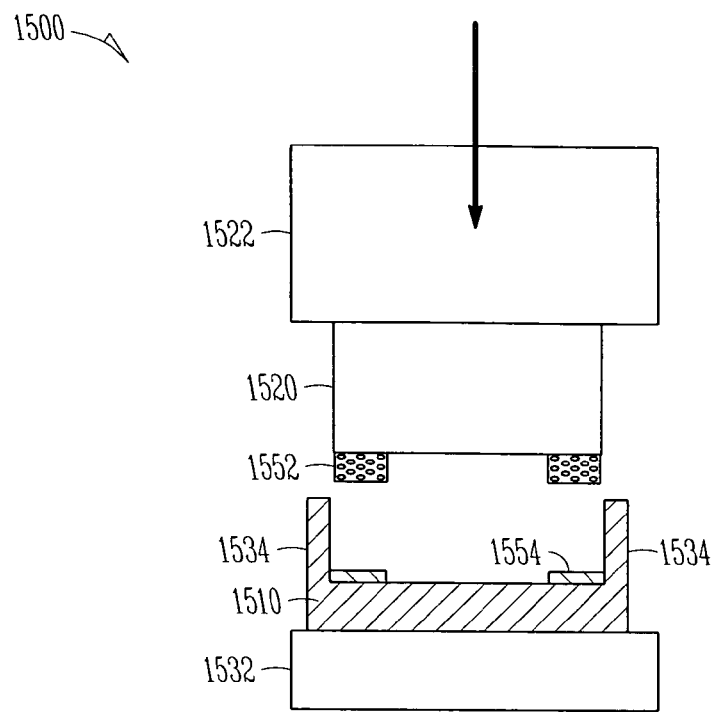
FIG. 15 is a schematic of a process embodiment.

FIG. 15 is a schematic 1500 of a process embodiment. The schematic 1500 depicts a stamping process according to an embodiment. In this embodiment, a pre-formed heat spreader substrate 1510 has taken a specific shape prior to the stamping process. In this embodiment, an IHS 1510 is depicted. A press positive 1520 that is carrying a heat transfer preform 1552 similar to the matrix of the second heat transfer structure 852 (FIG. 8), is stamped against a solder preform 1554. The press positive 1520 is articulated against the solder preform 1554 by the action of a press 1522 as indicated by the heavy downward vertical arrow. Since the IHS 1510 has significant dimensions, the solder preform 1554 is disposed between lip portions 1534 of the IHS 1510, the press positive 1520 presses against the IHS 1510 without damage to the lip portions 1534.

In one embodiment, the press 1522 includes a support 1532. The support 1532 is used to maintain the IHS 1510 during stamping of the matrix material 1552 against the solder preform 1554, and onto the IHS 1510. In one embodiment, the support 1532 is a heat source for processes described in this disclosure. Although the illustrated method embodiment depicts a solder preform 1554 and a matrix material 1552 during processing, all of the heat transfer subsystems and/or the heat transfer composites depicted in this disclosure and their art-recognized equivalents are included in this embodiment.

In a general embodiment, after bringing the IHS 1510 into intermediary contact with the solder preform 1554 and the matrix material 1552, bonding the heat transfer subsystem includes reflowing the metal embodiment of the second heat transfer structure 1552, and/or curing an organic embodiment of the second heat transfer structure 1552. Where the bonding heat transfer subsystem includes an organic material, a curing and/or hardening process can be carried out after bringing the structures together. Where the bonding heat transfer subsystem includes an organic/inorganic composite, curing, hardening, and/or reflowing can be carried out after bringing the structures together.

For the embodiments depicted in FIG. 15, processing conditions include a temperature range between ambient and about 160° C. In one embodiment before stamping, the IHS 1510 or generically, a heat spreader substrate is heated above ambient. In one embodiment, stamping is carried out at a temperature for the container barrier subsystem according to an approximation $(T_{TIM}-T_{AMB})/2$. In this temperature approximation, $T_{TIM}$ is the Centigrade melting temperature of the plurality or majority of metals in the container barrier subsystem. Further, $T_{AMB}$ is the Centigrade ambient temperature and is typically about 25° C.

The stamping pressure can depend upon the container barrier subsystem material and whether there is a cladding layer. In one embodiment, a pressure of about 200 pounds force per square inch is used. In one embodiment, a pressure of about 400 pounds force per square inch is used. In one embodiment, a pressure in a range from about 200 pounds force per square inch to about 400 pounds force per square inch is used.

EXAMPLE 1

Reference is made to FIG. 1, FIG. 8, and FIG. 15. In a first example, an IHS-grade copper heat spreader substrate 112 is clad with a nickel cladding layer 128. An indium solder preform 854 is supplied to a press 1522, and the press positive 1520 is articulated in a stamping motion against the solder preform 854. The solder preform 854 is preheated by the support 1532 to about 86° C., and the press positive 1520 exerts a force of about 400 pounds force per square inch. In this example, the matrix 852 is also stamped, either simultaneously with the solder preform 854, or in sequence. After the stamping process, a heat sink assembly is achieved that includes a heat spreader substrate 112 and a composite TIM 801.

EXAMPLE 2

Reference is made to FIG. 1, FIG. 11, and FIG. 15. In a second example, an IHS-grade copper heat spreader substrate is stamped with an indium solder preform 1154 and a blended indium solder-polymer (PSH) middle structure 1158. The indium solder preform 1154 and the blended indium-polymer PSH middle structure 1158 are supplied to a press 1522, and the press positive 1520 is articulated in a stamping motion against the indium solder preform 1154 etc. The indium solder preform 1154 is preheated by the support 1532 to about 86° C., and the press positive 1520 exerts a force of about 400 pounds force per square inch.

After the stamping process a heat sink assembly is achieved that includes a container barrier composite 1101 that is bonded to an IHS 112.

Figure 16:
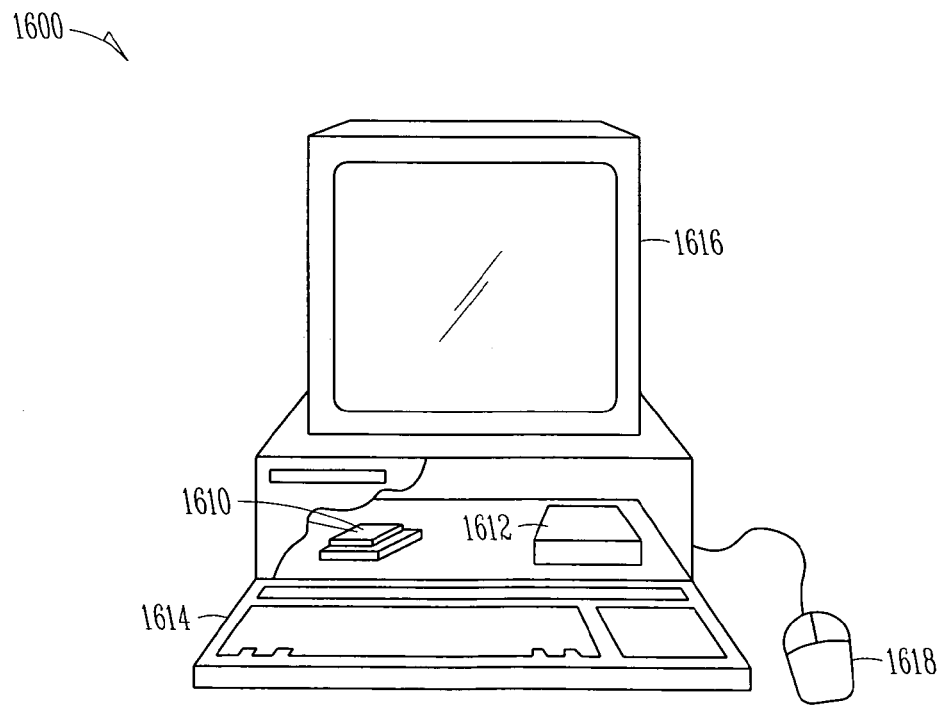
FIG. 16 is a depiction of a computing system according to an embodiment.

FIG. 16 is a schematic of a computing system 1600 according to an embodiment. One or more of the foregoing embodiments of a container barrier system or a container barrier composite may be utilized in a package for a computing system, such as the computing system 1600 of FIG. 16. The computing system 1600 includes at least one processor (not pictured) packaged with a container barrier system or a container barrier composite 1610, a data storage system 1612, at least one input device such as keyboard 1614, and at least one output device such as monitor 1616, for example. The computing system 1600 includes a processor that processes data signals, and may comprise, for example, a microprocessor, available from Intel Corporation. In addition to the keyboard 1614, the computing system 1600 can include another user input device such as a mouse 1618, for example. The computing system 1600 may utilize one or more microelectronic packages such as described in one or more of the foregoing embodiments. For purposes of this application, a computing system 1600 embodying components in accordance with the claimed subject matter may include any system that utilizes a microelectronic package, which may include, for example, a data storage device such as dynamic random access memory, polymer memory, flash memory, and phase-change memory. The microelectronic package can also include a die that contains a digital signal processor (DSP), a micro-controller, an application specific integrated circuit (ASIC), or a microprocessor. It can now be appreciated that embodiments set forth in this disclosure can be applied to devices and apparatuses other than a traditional computer. For example, a die can be packaged with an embodiment of the container barrier subsystem or the container barrier composite and placed in a portable device such as a wireless communicator or a hand-held such as a personal data assistant and the like. Another example is a die that can be packaged with an embodiment of the container barrier subsystem or the container barrier composite and placed in a vehicle such as an automobile, a locomotive, a watercraft, an aircraft, or a spacecraft.

Figure 17:
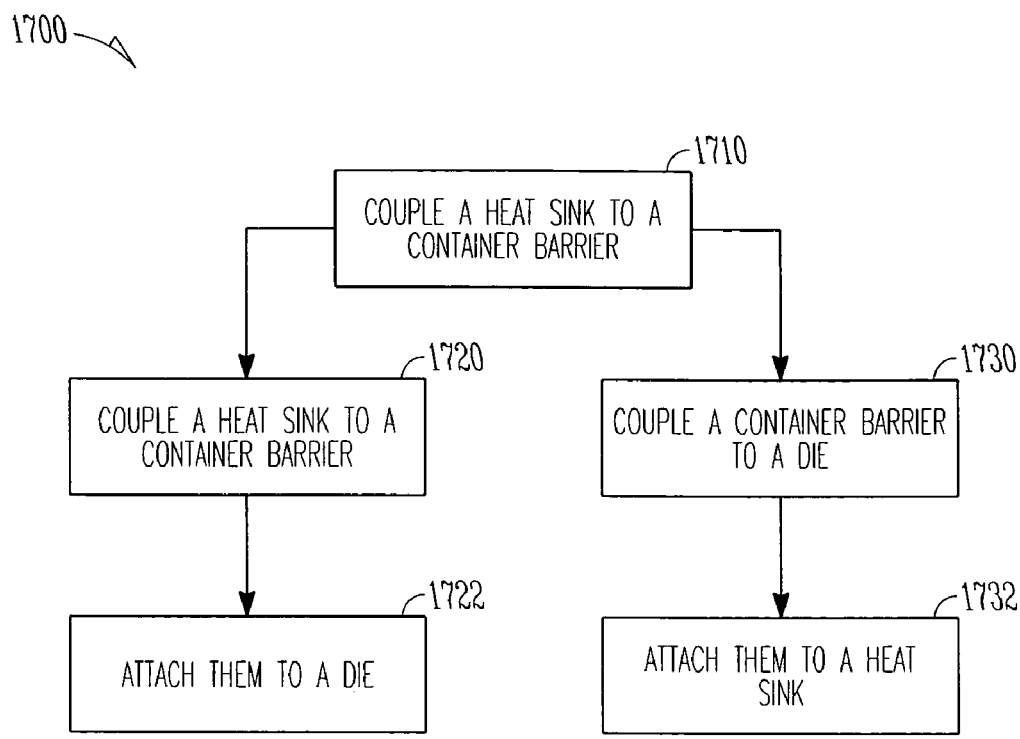
FIG. 17 is a process flow diagram and a method flow design according to various embodiments.

FIG. 17 is a process flow diagram and a method flow diagram according to various embodiments. The fabrication of a microelectronic package includes the formation of the container barrier system or the container barrier composite article according to embodiments set forth in this disclosure. The process 1700 includes embodiments that relate to the formation of a container barrier system or a container barrier composite article.

At 1710, a container barrier system or a container barrier composite article is formed. In the forming process, the container barrier subsystem or the container barrier composite includes a die-adhesive material and a heat spreader-adhesive material. At 1710, one process embodiment is completed.

At 1720, a method combines with the process flow to assemble the container barrier subsystem or a container barrier composite with a heat sink such as an IHS or the like. At 1720, one method flow embodiment is completed.

At 1722, the container barrier and the heat sink are attached to a die to form a package.

An alternative method is also depicted.

At 1730, a container barrier subsystem or a container barrier composite is coupled to a die to form a die unit.

At 1732 the die unit is coupled with a heat sink such as an IHS to form a package.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the subject matter as expressed in the subjoined claims.

What is claimed is:

1. An article comprising:
   a heat spreader including a die side and a heat-sink side;
   a first channel through the heat spreader that communicates from the die side to the heat-sink side;
   a container barrier disposed on the heat spreader die side, wherein the container barrier and the heat spreader form a recess upon the die side; and
   a first channel through the container barrier, wherein the first channel is adjacent the heat spreader die side; and
   a first plug disposed in the first channel through the container barrier.

2. The article of claim 1, further including:
   a first plug disposed in the first channel through the heat spreader;
   a second channel through the heat spreader to communicate from the die side to the heat-sink side.

3. The article of claim 1, wherein the first plug disposed in the first channel through the container barrier is gas-permeable and liquid-impermeable.

4. The article of claim 1, further including:
   a first plug disposed in the first channel through the heat spreader, wherein the first plug is gas-permeable and liquid-impermeable;
   a second channel through the container barrier to communicate from the die side to the heat-sink side; and
   a second plug disposed in the second channel through the heat spreader, wherein the second plug is gas-permeable and liquid-impermeable.

5. The article of claim 1, wherein the container barrier is selected from a solder, a leaded solder, a lead-free solder, a reactive solder, an indium material, a tin material, a silver material, a tin-silver material, a tin-silver-indium material, and combinations thereof.

6. The article of claim 1, wherein the container barrier is selected from a metal; a polymer-solder hybrid; a polymer matrix and a metal preform; and a polymer matrix, a metal preform, and a middle heat transfer structure disposed therebetween.

7. The article of claim 1, further including:
   a liquid heat-transfer medium disposed in the recess.

8. The article of claim 1, further including:
   a liquid heat-transfer medium disposed in the recess, wherein the liquid heat-transfer medium is selected from an organic composition, a metal, and combinations thereof.

9. A package comprising:
   a heat spreader including a die side and a heat-sink side;
   a first channel through the heat spreader to communicate from the die side to the heat-sink side;
   a first plug disposed in the first channel through the heat spreader;
   a container barrier disposed on the heat spreader die side, wherein the container barrier and the heat spreader forms a recess upon the die side;
   a liquid heat-transfer medium disposed in the recess; and
   a first channel through the container barrier, wherein the first channel is adjacent the heat spreader die side.

10. The package of claim 9, wherein the heat spreader is selected from a heat slug, a heat pipe, and an integrated heat spreader.

11. The package of claim 9, wherein the die side of the heat spreader includes a convoluted interface with the liquid heat-transfer medium.

12. The package of claim 9, further including:
    a second channel through the heat spreader to communicate from the die side to the heat-sink side.

13. The package of claim 9, further including:
    a first plug disposed in the first channel through the container barrier.

14. The package of claim 9, further including:
    a first plug disposed in the first channel through the heat spreader; and
    a second channel through the container barrier.

15. The package of claim 9, further including:
    a die in contact with the liquid heat transfer medium.

16. The package of claim 9, further including:
    a die in contact with the liquid heat transfer medium; and
    a mounting substrate coupled to the die.

17. A computing system comprising:
    a heat spreader including a die side and a heat-sink side;
    a first channel through the heat spreader that communicates from the die side to the heat-sink side;
    a container barrier disposed on the heat spreader die side, wherein the container barrier and the heat spreader form a recess upon the die side;
    a first channel through the container barrier, wherein the first channel is adjacent the heat spreader die side;
    a die in contact with the container barrier;
    a liquid heat-transfer medium disposed in the recess; and
    dynamic random access memory coupled to the die.

18. The computing system according to claim 17, wherein the computing system is disposed in one of a computer, a wireless communicator, a hand-held device, an automobile, a locomotive, an aircraft, a watercraft, and a spacecraft.

19. The computing system according to claim 17, wherein the die is selected from a data storage device, a digital signal processor, a micro-controller, an application specific integrated circuit, and a microprocessor.

* * * * *